(12) United States Patent
Su

(10) Patent No.: US 11,806,833 B2
(45) Date of Patent: Nov. 7, 2023

(54) CHEMICAL MECHANICAL PLANARIZATION SYSTEM AND A METHOD OF USING THE SAME

(71) Applicant: Taiwan Semiconductor Manufacturing Co., Ltd., Hsinchu (TW)

(72) Inventor: Fang-Yi Su, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 769 days.

(21) Appl. No.: 16/554,441

(22) Filed: Aug. 28, 2019

(65) Prior Publication Data

US 2020/0070307 A1 Mar. 5, 2020

Related U.S. Application Data

(60) Provisional application No. 62/725,624, filed on Aug. 31, 2018.

(51) Int. Cl.

| *B24B 37/005* | (2012.01) |
| *B24B 37/20* | (2012.01) |
| *B24B 53/017* | (2012.01) |
| *B24B 49/12* | (2006.01) |
| *H01L 21/67* | (2006.01) |
| *H01L 21/321* | (2006.01) |
| *G06T 7/00* | (2017.01) |

(Continued)

(52) U.S. Cl.
CPC ............ *B24B 49/18* (2013.01); *B24B 37/005* (2013.01); *B24B 37/20* (2013.01); *B24B 49/12* (2013.01); *B24B 53/017* (2013.01); *G01N 21/95607* (2013.01); *G06T 7/001* (2013.01); *H01L 21/3212* (2013.01); *H01L 21/67253* (2013.01); *G01N 2021/95615* (2013.01); *G06T 2207/30164* (2013.01)

(58) Field of Classification Search
None
See application file for complete search history.

(56) References Cited

U.S. PATENT DOCUMENTS

| 2002/0137434 | A1* | 9/2002 | Choi ..................... B24B 37/20 |
| | | | 451/28 |
| 2009/0137187 | A1 | 5/2009 | Sung |
| 2014/0113532 | A1 | 4/2014 | Smith et al. |

(Continued)

FOREIGN PATENT DOCUMENTS

| CN | 1859998 A | * 11/2006 | ............. B24B 37/00 |
| CN | 102725832 A | * 10/2012 | ........... B24B 37/005 |

(Continued)

*Primary Examiner* — Sylvia Macarthur
(74) *Attorney, Agent, or Firm* — SEED IP LAW GROUP LLP

(57) ABSTRACT

The various described embodiments provide a CMP system and a method of using the same. The CMP system includes an imaging device, such as a laser scanner, that obtains an image of a dresser of the CMP system in real time or in-situ with a CMP process. A processing device of the CMP system compares the obtained image with one or more of reference images to determine whether or not the dresser has a defect. The processing device then adjusts the CMP process based on whether or not the dresser includes a defect.

16 Claims, 4 Drawing Sheets

(51) Int. Cl.
*G01N 21/956* (2006.01)
*B24B 49/18* (2006.01)

(56) References Cited

U.S. PATENT DOCUMENTS

| | | | | |
|---|---|---|---|---|
| 2015/0170978 A1* | 6/2015 | Chen | ................. | B24B 49/12 |
| | | | | 702/172 |
| 2015/0202736 A1* | 7/2015 | Chou | ................. | B24B 53/017 |
| | | | | 451/443 |
| 2015/0364389 A1* | 12/2015 | Fukushima | ............. | H01L 22/26 |
| | | | | 156/345.13 |
| 2016/0163035 A1* | 6/2016 | Chang | ................. | G06K 9/6274 |
| | | | | 382/149 |
| 2016/0172255 A1* | 6/2016 | Kramer | ................. | B24B 53/017 |
| | | | | 438/4 |
| 2017/0239777 A1* | 8/2017 | Chung | ................. | B24B 49/12 |
| 2018/0093363 A1* | 4/2018 | Shinozaki | ............. | B24B 53/005 |
| 2019/0188840 A1* | 6/2019 | Kwon | ................. | G06N 20/10 |
| 2020/0070307 A1* | 3/2020 | Su | ................. | B24B 37/005 |

FOREIGN PATENT DOCUMENTS

| | | | | | |
|---|---|---|---|---|---|
| CN | 105097578 | A | | 11/2015 | |
| CN | 10787735 | A | * | 4/2018 | |
| CN | 107877354 | A | | 4/2018 | |
| CN | 108500843 | A | * | 9/2018 | ............ B24B 49/16 |
| JP | 2001223190 | A | * | 8/2001 | ............ B24B 37/20 |
| JP | 2007030118 | A | * | 2/2007 | |
| KR | 20060001933 | A | * | 1/2006 | |
| KR | 20070069846 | A | * | 7/2007 | |
| KR | 1020140111923 | A | * | 9/2014 | ........... B24B 37/005 |
| TW | M437456 | U1 | | 9/2012 | |
| TW | 1463552 | B | | 12/2014 | |

* cited by examiner

CHEMICAL MECHANICAL PLANARIZATION SYSTEM AND A METHOD OF USING THE SAME

PRIORITY CLAIM

The present application claims priority to provisional U.S. Application No. 62/725,624, filed on Aug. 31, 2018.

BACKGROUND

Semiconductor devices include various layers, such as semiconductor and metallization layers, formed on top of one another. The various layers are formed using various semiconductor processing techniques, such as chemical vapor deposition (CVD), high density plasma deposition, spin-on deposition, sputtering, or other suitable techniques. During fabrication, a layer is often smoothed using, for example, a planarization process to provide a flat surface for a subsequent layer.

A common planarization process is chemical mechanical planarization (CMP). Generally, a CMP process uses chemical and physical forces to smooth or planarize layers, such as semiconductor and metallization layers of a semiconductor device. During a CMP process, a workpiece, such as a semiconductor wafer, is brought into physical contact with a rotating polishing pad while a slurry of chemical and abrasive components are introduced on to the workpiece. The rotating polishing pad and the slurry together remove material from the workpiece until the workpiece has a flat or planar surface.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
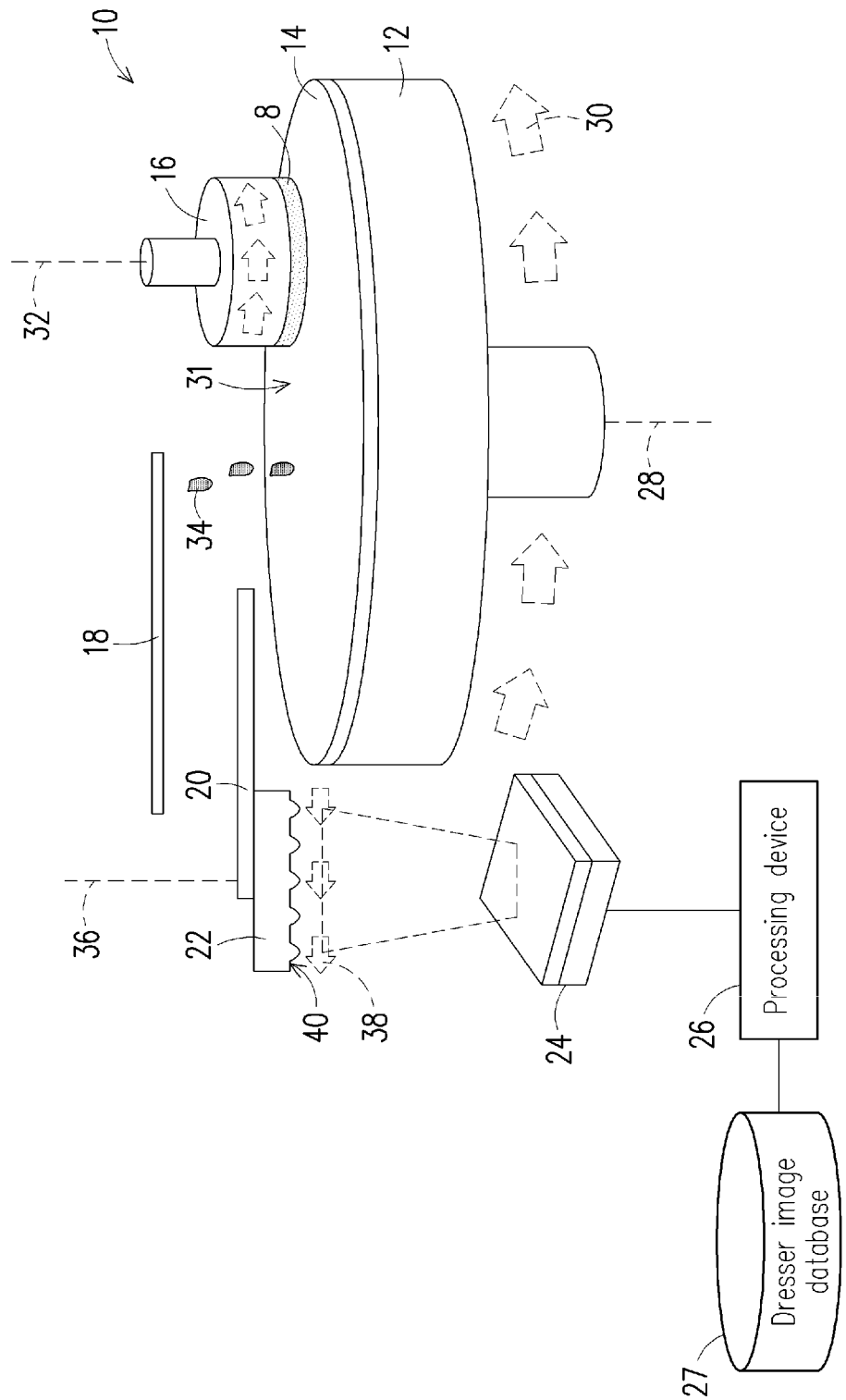
FIG. 1 is a diagram of a chemical mechanical planarization (CMP) system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Chemical mechanical planarization (CMP) is typically used to smooth or planarize a workpiece, such as a semiconductor wafer, during fabrication of semiconductor devices. In general, a CMP process uses chemical and physical forces to smooth or planarize the workpiece. In particular, the workpiece is brought into physical contact with a rotating polishing pad while a slurry of chemical and abrasive components are introduced on to the workpiece. The rotating polishing pad and the slurry remove material from the workpiece until the workpiece has a flat or planar surface.

Over time, by-products of the slurry, the workpiece, and/or the polishing pad may accumulate or become embedded within the polishing pad, and create a rough surface on the polishing pad. Consequently, the polishing pad, itself, may unintentionally scratch the workpiece when the workpiece is brought into physical contact with the rotating polishing pad.

To avoid this, a dresser, sometimes referred to as a conditioning pad, is used to recondition the polishing pad during the CMP process. The dresser includes an abrasive surface (e.g., diamond grit), and is moved across the rotating polishing pad. The dresser abrades the polishing pad and removes any by-products that may have accumulated or become embedded within the polishing pad. As a result, a rough surface will not form on the polishing pad, and scratches to the workpiece caused by the polishing pad may be avoided.

Unfortunately, the dresser itself, may also become damaged during a CMP process. For example, as previously discussed, by-products of the slurry, the workpiece, and/or the polishing pad may accumulate or become embedded within the polishing pad, and create a rough surface on the polishing pad. The rough surface of the polishing pad may in turn damage the abrasive surface of the dresser causing the abrasive surface of the dresser to be less abrasive or smoother. The dresser may also become damaged from the by-products of the slurry, the workpiece, and/or the polishing pad, themselves. For example, the by-products may wear the abrasive surface of the dresser and reduce the abrasiveness of the abrasive surface.

Damage to the dresser's abrasive surface minimizes the dresser's effectiveness in reconditioning the polishing pad and preventing rough surfaces from forming on the polishing pad. Consequently, workpieces, such as semiconductor wafers, may become scratched during the CMP process. Accordingly, it is important to monitor and detect whether or not the dresser is damaged or defective.

The present disclosure is directed to a CMP system and a method of using the same. The CMP system includes an imaging device, such as a laser scanner, that obtains an image of a dresser of the CMP system in real time or in-situ with a CMP process. A processing device of the CMP system compares the obtained image with one or more of reference images to determine whether or not the dresser has a defect. The processing device then adjusts the CMP process based on whether or not the dresser includes a defect. For example, as will be discussed in further detail below, in a case where the processing device determines that the dresser has a defect, the processing device may adjust the CMP process by halting the CMP process (e.g., controlling at least one of a turn table to stop rotating, a carrier to remove a workpiece from physical contact with a polishing pad, a carrier to stop rotating, a dresser arm to stop moving a dresser across a polishing pad, and a dresser arm to stop rotating a dresser). As another example, in a case where the processing device determines that the dresser has a defect, the processing device may adjusts the CMP process by adjusting the speed at which the CMP process is being performed (e.g., controlling at least one of a turn table to reduce the turn table's rotating speed, a carrier to reduce the carrier's rotating speed, a dresser arm to reduce the movement speed of the dresser across the polishing pad, and a dresser arm to reduce the rotating speed of the dresser). For example, in a case where the processing device determines that the dresser has a defect, the processing device may halt the CMP process. Conversely, in a case where the processing device determines that the dresser does not have a defect, the processing device may continue the CMP process.

FIG. 1 is a diagram of a chemical mechanical planarization (CMP) system 10 in accordance with some embodiments. The CMP system 10 performs a CMP process on a workpiece 8. The workpiece 8 may be any object on which a planarization process may be performed. For example, the workpiece 8 may be a semiconductor device, a semiconductor wafer, or a layer of material (e.g., conductive layer, semiconductor layer, etc.). The CMP system 10 includes a turn table 12, a polishing pad 14, a carrier 16, a slurry applicator 18, a dresser arm 20, a dresser 22, an imaging device 24, a processing device 26, and a dresser image database 27.

The turn table 12 provides a platform for the polishing pad 14. The turn table 12 rotates around an axis of rotation 28. The turn table 12 may rotate in a clockwise or a counterclockwise direction. In one embodiment, the turn table 12 rotates in a first direction 30 (i.e., counterclockwise).

The polishing pad 14 is positioned on top of the turn table 12 such that the polishing pad 14 rotates as the turn table 12 rotates. Namely, in one embodiment, the polishing pad 14 rotates in the first direction 30 as the turn table 12 rotates in the first direction 30.

The polishing pad 14 may be made any type of material used for polishing surfaces. In one embodiment, the polishing pad 14 is made of a polymeric material. In one embodiment, the polishing pad 14 is porous. As will be discussed in further detail below, the polishing pad 14 polishes or planarizes the workpiece 8.

The carrier 16 is positioned above the polishing pad 14. The carrier 16 secures or holds the workpiece 8, and brings the workpiece 8 into physical contact with an upper surface 31 of the polishing pad 14. In addition, the carrier 16 rotates around an axis of rotation 32. The carrier 16 may rotate in clockwise or a counterclockwise direction. In one embodiment, the carrier 16 rotates in the same direction as the turn table 12. For example, as shown in FIG. 1, the carrier 16 rotates in the first direction 30 (i.e., counterclockwise). As will be discussed in further detail below, the carrier 16 brings the workpiece 8 into physical contact with the upper surface 31 of the polishing pad 14.

The slurry applicator 18 dispenses slurry 34 onto the upper surface 31 of the polishing pad 14. The slurry 34 is a polishing mixture that includes a mixture of chemical and abrasive components. In one embodiment, the slurry 34 includes a chemical solution, such as $H_2O_2$ or $NH_4OH$, that is able to carry and hold abrasive particles, such as $SiO_2$ or $Al_2O_3$. As will be discussed in further detail below, the slurry applicator 18 dispenses the slurry 34 while the polishing pad 14 is polishing the workpiece 8 to help grind away and smooth a surface of the workpiece 8.

The dresser arm 20 holds the dresser 22 and moves the dresser 22 across the upper surface 31 of the polishing pad 14. In one embodiment, the dresser arm 20 also rotates the dresser 22 around an axis of rotation 36. The dresser arm 20 may rotate the dresser 22 in clockwise or a counterclockwise direction. In one embodiment, the dresser arm 20 rotates the dresser 22 in an opposite direction as the turn table 12. For example, as shown in FIG. 1, the dresser arm 20 rotates the dresser 22 in a second direction 38 (i.e., clockwise).

In one embodiment, the dresser arm 20 is configured to position the dresser 22 either in physical contact with the polishing pad 14 or above the imaging device 24. For example, as shown in FIG. 1, the dresser arm 20 is positioning the dresser 22 above the imaging device 24. In one embodiment, the dresser arm 20 positions the dresser 22 to be in physical contact with the polishing pad 14 when the polishing pad 14 should be reconditioned by the dresser 22. In one embodiment, the dresser arm 20 positions the dresser 22 above the imaging device 24 when reconditioning of the polishing pad 14 is unnecessary and/or an image of the dresser 22 should be obtained. The reconditioning of the polishing pad 14 and the imaging device 24 will be discussed in further detail below.

The dresser 22 includes an abrasive surface 40. The abrasive surface 40 may include any type of abrasive particle. For example, the dresser 22 may include a substrate with particles of $SiO_2$ or or $Al_2O_3$ attached to the substrate. In one embodiment, the dresser 22 is a diamond disk and the abrasive surface 40 is diamond grit. As will be discussed in further detail below, the dresser 22 reconditions the polishing pad 14 by abrading the upper surface 31 of the polishing pad 14 and removing any by-products (e.g., by-products of the slurry, the workpiece, and/or the polishing pad) that may have accumulated or become embedded within the polishing pad 14.

The imaging device 24 obtains an image of the dresser 22. In particular, the imaging device 24 captures an image of the abrasive surface 40. The imaging device 24 may be any type of imaging device 24, such as a laser scanner or an optical scanner camera. In one embodiment, the imaging device 24 is a laser scanner. As will be discussed in further detail below, the imaging device 24 captures an image of the abrasive surface 40 in real time or in-situ with a CMP process being performed by the CMP system 10.

In one embodiment, the imaging device 24 obtains an image of the entire abrasive surface 40 of the dresser 22. Stated differently, the imaging device 24 is capable of scanning all of the abrasive surface 40 with a single scan. In one embodiment, the imaging device 24 captures multiple images of the abrasive surface 40 in order to obtain an image of the entire abrasive surface 40. In one embodiment, the imaging device 24 captures a portion of the abrasive surface 40 of the dresser 22.

As discussed above, in one embodiment, the dresser arm 20 is configured to position the dresser 22 either in physical contact with the polishing pad 14 or above the imaging device 24. For example, as shown in FIG. 1, the dresser arm 20 is positioning the dresser 22 above the imaging device 24. In one embodiment, the imaging device 24 captures an image of the abrasive surface 40 while the dresser arm 20 positions the dresser 22 above the imaging device 24.

In one embodiment, the dresser 22 is completely removed from the CMP system 10 before being scanned. Namely, in one embodiment, the dresser 22 is removed from the dresser arm 20, and is then scanned by the imaging device 24.

In one embodiment, the imaging device 24 obtains an image of the abrasive surface 40 of the dresser 22 in real time or in-situ with a CMP process. In one embodiment, the imaging device 24 obtains an image of the abrasive surface 40 of the dresser 22 while the dresser 22 is reconditioning the polishing pad 14. In one embodiment, the imaging device 24 obtains an image of the abrasive surface 40 of the dresser 22 while the polishing pad 14 is polishing the workpiece 8. In one embodiment, the imaging device 24 obtains an image of the abrasive surface 40 of the dresser 22 between recondition performed by the dresser 22.

The processing device 26 is communicatively coupled to the CMP system 10. The processing device 26 and the CMP system 10 may be communicatively coupled to each other using any type of communication system. In one embodiment, the processing device 26 is communicatively coupled to the CMP system 10 via a wired communication interface. In one embodiment, the processing device 26 is communicatively coupled to the CMP system 10 via a wireless communication interface (e.g., Bluetooth, the Internet, etc.).

The processing device 26 may be any type of processing device. For example, the processing device 26 may be a processor, a controller, a personal computer, a laptop, a mobile device, a tablet, etc.

In one embodiment, the processing device 26 controls the CMP system 10. For example, as will be discussed with respect to FIG. 2, the processing device 26 controls the CMP system 10 to perform a CMP process on the workpiece 8 and to detect whether or not the dresser 22 includes any defects. In one embodiment, the processing unit includes or is coupled to a control unit that controls the CMP system 10. The CMP process will be discussed with respect to FIG. 2.

The dresser image database 27 is communicatively coupled to the processing device 26. The dresser image database 27 and the processing device 26 may be communicatively coupled to each other using any type of communication system. In one embodiment, the dresser image database 27 is communicatively coupled to the processing device 26 via a wired communication interface. In one embodiment, the dresser image database 27 is communicatively coupled to the processing device 26 via a wireless communication interface (e.g., Bluetooth, the Internet, etc.).

The dresser image database 27 may be any type of storage or memory device. In one embodiment, the dresser image database 27 and the processing device 26 is within a single device. In one embodiment, the dresser image database 27 and the processing device 26 are in separate devices. In one embodiment, the dresser image database 27 is located at a remote location from the processing device 26.

The dresser image database 27 collects and stores a plurality of reference dresser images. In one embodiment, the reference dresser images are dresser images that have been predetermined as either having at least one defect or having no defects (or an acceptable amount of defects). The reference dresser images are used to determine whether the dresser 22 includes any defects. Utilization of the reference dresser images stored in the dresser image database 27 will be discussed in further detail with respect to FIG. 2.

The dresser image database 27 may collect dresser images from a wide variety of sources. In one embodiment, the reference dresser images are dresser images that were obtained by the imaging device 24 during prior CMP processes. In one embodiment, the reference dresser images are dresser images that were obtained by other imaging devices of other CMP systems during prior CMP processes.

Figure 2:
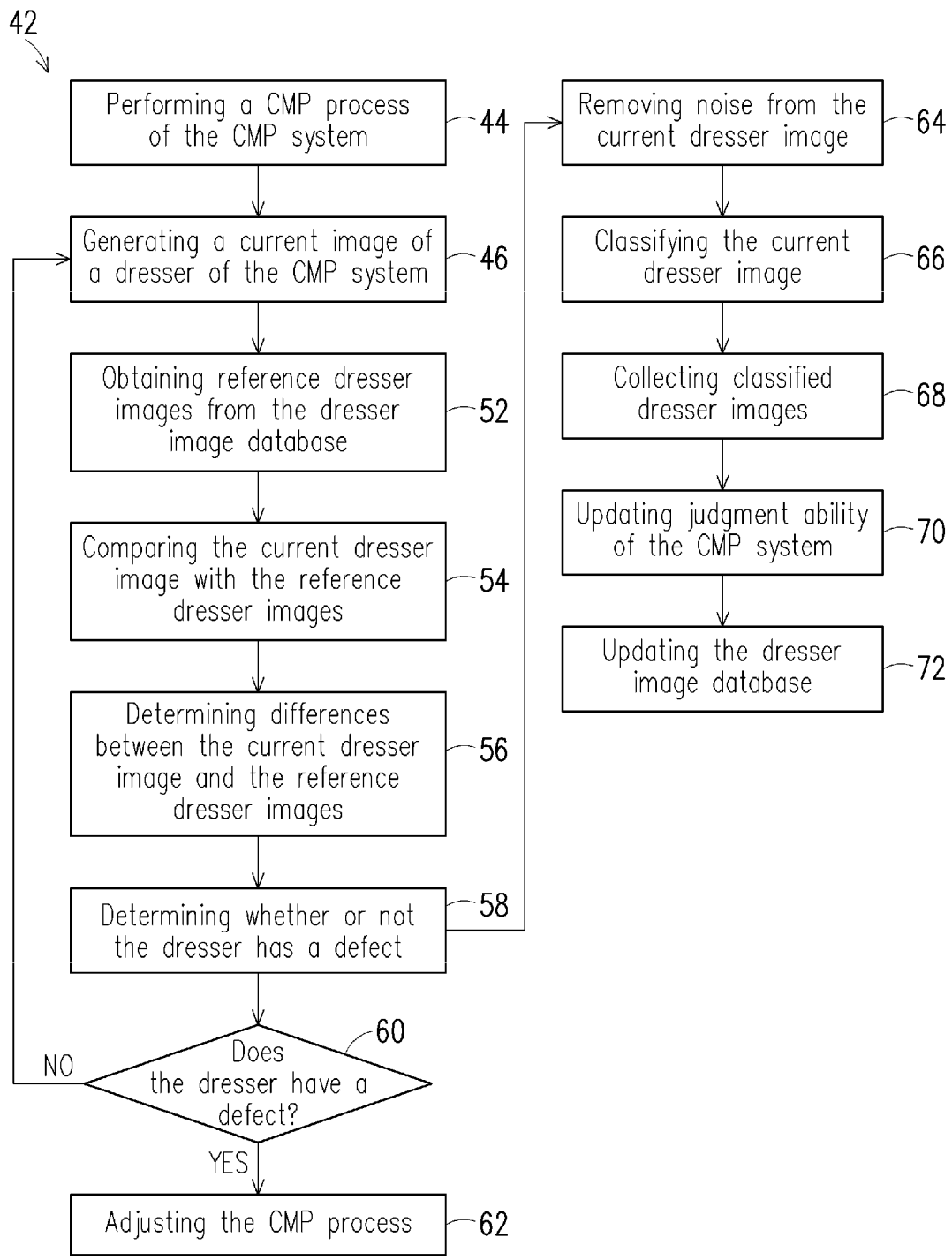
FIG. 2 is a flow diagram of a method of operating the CMP system of FIG. 1 in accordance with some embodiments.

FIG. 2 is a flow diagram of a method 42 of operating the CMP system 10 of FIG. 1 in accordance with some embodiments.

In block 44, a CMP process of the CMP system 10 is performed. Initially, the processing device 26 instructs the turn table 12 to rotate in, for example, the first direction 30, which in turn rotates the polishing pad 14 in the first direction 30. The processing device 26 also instructs the carrier 16 to rotate in, for example, the first direction 30.

While both the polishing pad 14 and the carrier 16 are rotating, the processing device 26 instructs the carrier 16 to bring the workpiece 8 into physical contact with the upper surface 31 of the polishing pad 14. As a result, the polishing pad 14 polishes or planarizes the workpiece 8. In addition, while the workpiece 8 is in physical contact with the upper surface 31 of the polishing pad 14, the processing device 26 instructs the slurry applicator 18 to dispense the slurry 34 onto the upper surface 31 to help grind away and smooth a surface of the workpiece 8.

As discussed above, over time, by-products of the slurry 34, the workpiece 8, and/or the polishing pad 14 may accumulate or become embedded within to the polishing pad 14, and create a rough surface on the polishing pad. For example, in one embodiment, the polishing pad 14 is porous. In this embodiment, the by-products may become stuck within the pores of the polishing pad 14 and form a rough surface on the polishing pad 14. Consequently, the polishing pad 14, itself, may scratch the workpiece 8 when the workpiece 8 is brought into contact with the rotating polishing pad 14.

To prevent a rough surface from being formed on the polishing pad 14, the dresser 22 reconditions the polishing pad 14 during the CMP process of block 44. In particular, the processing device 26 instructs the dresser arm 20 to move and rotate the dresser 22 across the upper surface 31 of the polishing pad 14. As the dresser 22 includes the abrasive surface 40, the dresser 22 abrades the upper surface 31 of the polishing pad 14 and removes any by-products that may have accumulated or become embedded within the polishing pad 14. As a result, a rough surface will not form on the polishing pad 14, and scratches to the workpiece 8 caused by the polishing pad 14 may be avoided.

In one embodiment, the CMP process is performed simultaneously with blocks 46, 52, 54, 56, 58, 60, and 62, which will be discussed in further detail below. In one embodiment, the CMP process is performed simultaneously with blocks 46, 52, 54, 56, 58, 60, 62, 64, 66, 68, 70, and 72, which will be discussed in further detail below.

As previously discussed, the dresser 22 may also be damaged during the CMP process. For example, by-products of the slurry 34, the workpiece 8, and/or the polishing pad 14 may accumulate or become embedded within the polishing pad 14, and create a rough surface on the polishing pad 14. The rough surface of the polishing pad 14 may in turn damage the abrasive surface 40 of the dresser causing the abrasive surface 40 of the dresser to be less abrasive or smoother. The by-products of the slurry 34, the workpiece 8, and/or the polishing pad 14, themselves, may also damage the abrasive surface 40 of the dresser 22, and, thus, reduce the abrasiveness of the abrasive surface 40 of the dresser.

Damage to the abrasive surface 40 minimizes the dresser's effectiveness in reconditioning the polishing pad 14. Consequently, the dresser 22 will be unable to properly recondition the polishing pad 14 during the CMP process, and the workpiece 8 may become scratched. To avoid this, the dresser 22 is monitored for damage and/or defects in blocks 46, 52, 54, 56, 58, and 60 to ensure that the dresser 22 is not damaged or defective during the CMP process performed in block 44.

In block 46, a current image of the dresser 22 of the CMP system 10 is generated. Namely, the processing device 26 instructs the imaging device 24 to capture and generate a current image of the abrasive surface 40 of the dresser 22.

As previously discussed, the imaging device 24 may be any type of imaging device 24. In one embodiment, the imaging device 24 is a laser scanner, and the imaging device 24 scans the abrasive surface 40 to generate the current image of the abrasive surface 40.

In one embodiment, the imaging device 24 captures an image of the abrasive surface 40 periodically. For example, the imaging device 24 may capture an image every 5, 10, or 15 minutes. In one embodiment, the CMP process of block 44 is temporarily halted when the imaging device 24 captures an image of the abrasive surface 40. In one embodiment, the imaging device 24 captures an image of the abrasive surface 40 during the CMP process of block 44.

In one embodiment, the imaging device 24 captures an image of the abrasive surface 40 while the dresser arm 20 positions the dresser 22 above the imaging device 24, as shown, for example, in FIG. 1.

In one embodiment, the dresser 22 is completely removed from the CMP system 10 before being scanned. Namely, in one embodiment, the dresser 22 is removed from the dresser arm 20, and is then scanned by the imaging device 24.

In one embodiment, the imaging device 24 obtains an image of the abrasive surface 40 of the dresser 22 in real time or in-situ with a CMP process. In one embodiment, the imaging device 24 obtains an image of the abrasive surface 40 of the dresser 22 while the dresser 22 is reconditioning the polishing pad 14. In one embodiment, the imaging device 24 obtains an image of the abrasive surface 40 of the dresser 22 while the polishing pad 14 is polishing the workpiece 8. In one embodiment, the imaging device 24 obtains an image of the abrasive surface 40 of the dresser 22 between reconditions performed by the dresser 22.

Figure 3:
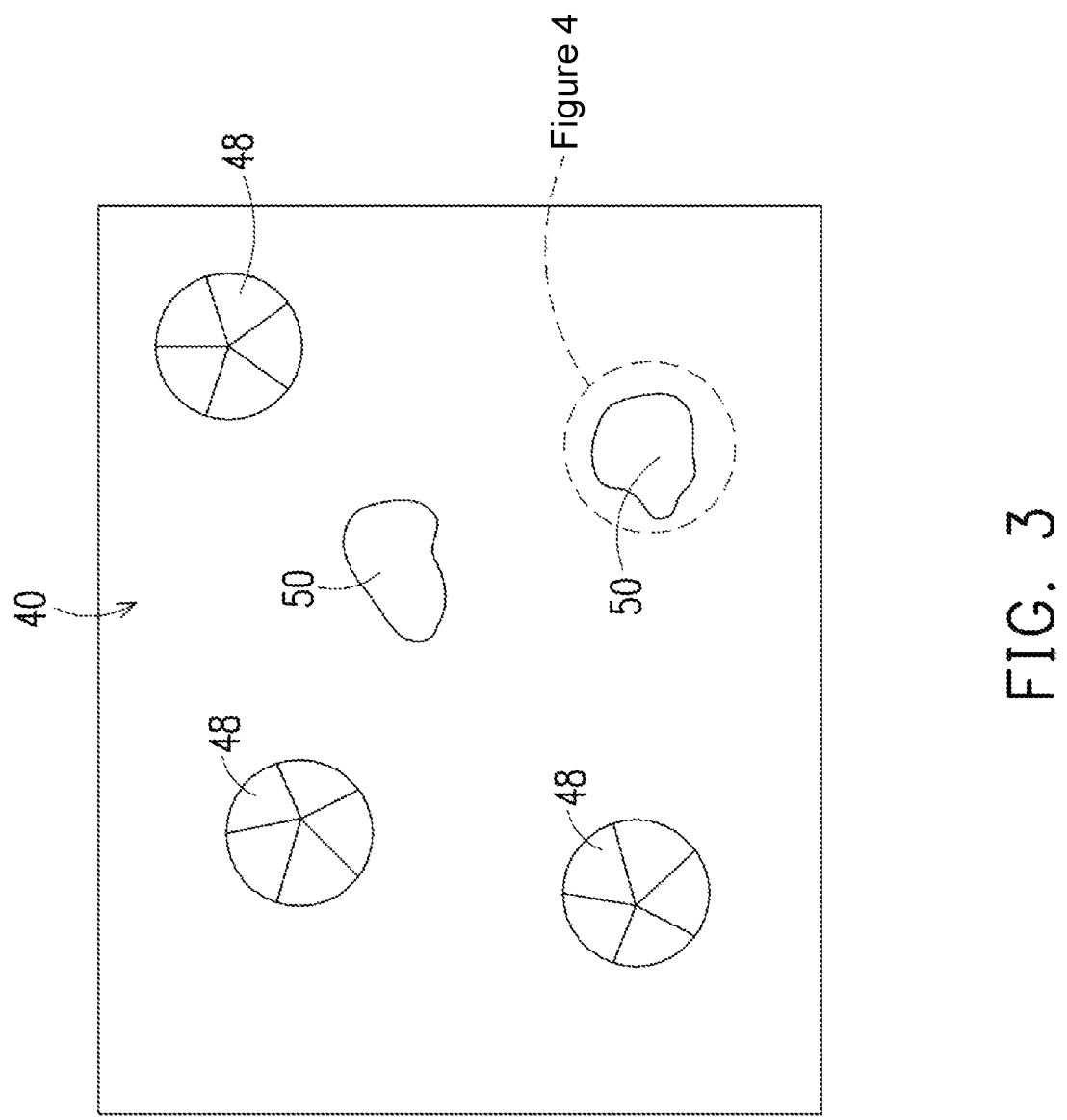
FIG. 3 is an enlarged plan view of a dresser of the CMP system of FIG. 1 in accordance with some embodiments.
Figure 4:
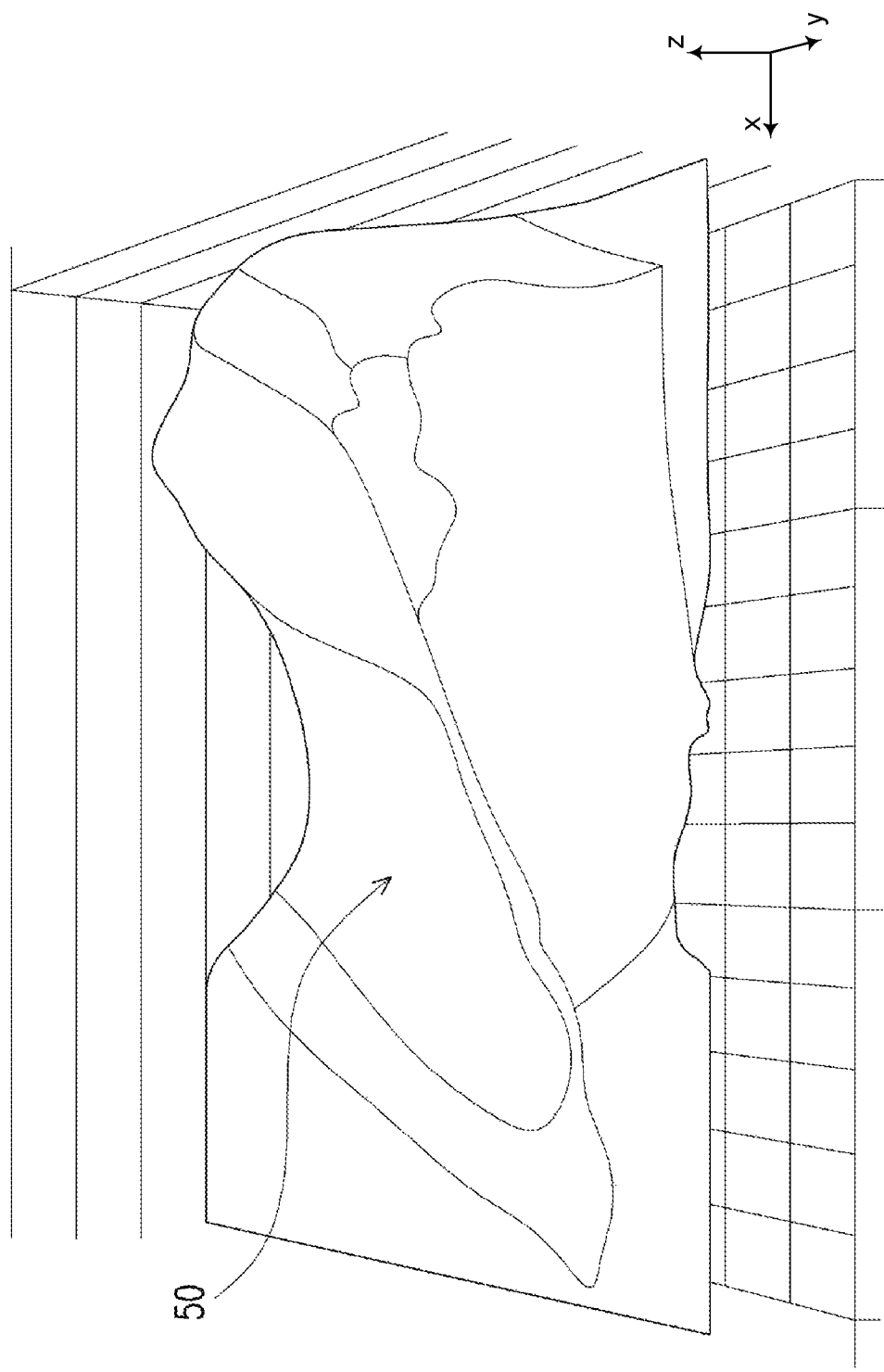
FIG. 4 is an image of a portion of the dresser of FIG. 3 that is obtained by an imaging device of the CMP system of FIG. 1 in accordance with some embodiments.

An example of an image of the abrasive surface 40 captured by the imaging device 24 is shown in FIGS. 3 and 4.

FIG. 3 is an enlarged plan view of the dresser 22 of the CMP system 10 in accordance with some embodiments. In particular, FIG. 3 is enlarged plan view of a portion of the abrasive surface 40 of the dresser 22. As shown in FIG. 3, the abrasive surface 40 of the dresser 22 includes teeth 48 and trenches 50.

The teeth 48 protrude from the dresser 22 and provide a coarse surface for the abrasive surface 40. It is noted that the dresser 22 may include any number of teeth. Further, the teeth may be made of any type of abrasive material. For example, as previously discussed, the dresser 22 may include a substrate with particles of $SiO_2$ or $Al_2O_3$ attached to the substrate. In one embodiment, the teeth 48 are diamond grit.

The trenches 50 are defects in the dresser 22. For example, the trenches 50 may be formed in a case where teeth of the abrasive surface 40 becomes damaged and are removed from the dresser 22. As discussed above, the dresser 22 may, for example, become damaged from a rough surface being formed on the polishing pad 14, and/or from by-products of the slurry 34, the workpiece 8, and/or the polishing pad 14.

FIG. 4 is an image of a portion of the dresser 22 that is obtained by the imaging device 24 of the CMP system 10 in accordance with some embodiments. In particular, FIG. 4 is an image of a single trench 50 in the dresser 22, which is encircled in FIG. 3.

In one embodiment, as shown in FIG. 4, the imaging device 24 is capable of scanning the abrasive surface 40 of the dresser 22, and generating a topographic map of the abrasive surface 40 with depth information of the abrasive surface 40. For example, the image of FIG. 4 shows the depth of the trench 50 and the areas surrounding the trench 50. In one embodiment, as discussed above, the imaging device 24 is a laser scanner, and laser scans the abrasive surface 40 to generate the image shown in FIG. 4.

Returning to FIG. 2, in block 52, the processing device 26 obtains reference dresser images from the dresser image database 27.

In one embodiment, the reference dresser images are dresser images that have been predetermined as having at least one defect. As will be discussed in further detail below, in a case where the reference dresser image is an image of a defective dresser, the processing device 26 may determine that the dresser 22 has a defect when a current dresser image is similar to the reference dresser image. Conversely, in a case where the reference dresser image is an image of a defective dresser, the processing device 26 may determine that the dresser 22 does not have a defect when a current dresser image is dissimilar to the reference dresser image.

In one embodiment, the reference dresser images are dresser images that have been predetermined as having no defects. As will be discussed in further detail below, in a case where the reference dresser image is an image of a non-defective dresser, the processing device 26 may determine that the dresser 22 does not have a defect when a current dresser image is similar to the reference dresser image. Conversely, in a case where the reference dresser image is an image of a non-defective dresser, the processing device 26 may determine that the dresser 22 has a defect when a current dresser image is dissimilar to the reference dresser image.

The processing device 26 may retrieve any number of reference dresser images from the dresser image database 27. In one embodiment, the processing device 26 retrieves a single reference dresser image from the dresser image database 27. In one embodiment, the processing device 26 retrieves a plurality of reference dresser image from the dresser image database 27.

In block 54, the current dresser image, which was generated in block 46, is compared with the reference dresser images obtained in block 52. Namely, the processing device 26 performs an image comparison between the current dresser image and each of the reference dresser images.

The processing device 26 may use any type of image comparison technique to compare the current dresser image with the reference dresser images.

In one embodiment, the processing device 26 compares the current dresser image with a reference dresser image by performing a pixel-by-pixel comparison of a subarea in the current dresser image with a corresponding subarea in the reference dresser image.

In one embodiment, the processing device 26 compares the current dresser image with a reference dresser image by performing a pixel-by-pixel comparison of the entire area in the current dresser image with the entire area of the reference dresser image.

In one embodiment, the processing device 26 compares the current dresser image with a reference dresser image by performing a pixel-by-pixel comparison of a plurality of subareas in the current dresser image with a single reference dresser image. In this embodiment, the single reference dresser image may be an image of a portion of a dresser, as opposed to an image of an entire dresser.

In block 56, differences between the current dresser image and the reference dresser images are determined. In particular, the processing device 26 determines differences between the current dresser image and each of the reference dresser images based on the comparison in block 54.

In one embodiment, the imaging device 24 is capable of scanning the abrasive surface 40 of the dresser 22, and generating a topographic map of the abrasive surface 40 with depth information of the abrasive surface 40. In this embodiment, in block 56, the processing device 26 determines differences between depth values of the current dresser image and depth values of the reference dresser images. For example, as discussed above, the processing device 26 may compare the current dresser image with a reference dresser image by performing a pixel-by-pixel comparison of a subarea in the current dresser image with a corresponding subarea in the reference dresser image. In this example, the processing device 26 determines differences between the depth values of the subarea in the current dresser image and the depth values of the corresponding subarea in the reference dresser image.

In one embodiment, the processing device 26 determines differences between pixel values (e.g., brightness or intensity levels of the pixels) of the current dresser image and pixel values of the reference dresser images. For example, as discussed above, the processing device 26 may compare the current dresser image with a reference dresser image by performing a pixel-by-pixel comparison of a subarea in the current dresser image with a corresponding subarea in the reference dresser image. In this example, the processing device 26 determines differences between the pixel values of the subarea in the current dresser image and the pixel values of the corresponding subarea in the reference dresser image.

In block 58, the processing device 26 determines whether or not the dresser 22 has a defect. In one embodiment, the processing device 26 determines whether or not the dresser 22 has a defect based on the differences between the current dresser image and the reference dresser images that were determined in block 56.

As previously discussed, in one embodiment, the reference dresser images may be dresser images that have been predetermined as having at least one defect and/or dresser images that have been predetermined as having no defects. Thus, as discussed below, the processing device 26 is able to determine whether or not the differences between the current dresser image and the reference dresser images is a defect in the dresser 22 based on how large or small the differences determined in block 56 are.

In one embodiment, in a case where the reference dresser image is predetermined as having at least one defect (i.e., the reference dresser image is an image of a defective dresser), the processing device 26 determines that the dresser 22 has a defect when the current dresser image and the reference dresser image are similar to each other. In particular, in a case where the reference dresser image is predetermined as having at least one defect, the processing device 26 determines that the dresser 22 has a defect when the differences determined in block 56 are below a predetermined threshold. For example, as previously discussed, in one embodiment, the processing device 26 determines differences between depth values of the current dresser image and depth values of the reference dresser images. In this embodiment, the processing device 26 determines the dresser 22 has a defect when an average of the differences between depth values of the current dresser image and depth values of the reference dresser image is smaller than a predetermined threshold. As another example, as previously discussed, in one embodiment, the processing device 26 determines differences between pixel values (e.g., brightness or intensity levels of the pixels) of the current dresser image and pixel values of the reference dresser images. In this embodiment, the processing device 26 determines the dresser 22 has a defect when an average of the differences between pixel values of the current dresser image and pixel values of the reference dresser image is smaller than a predetermined threshold.

In one embodiment, in a case where the reference dresser image is predetermined as having at least one defect (i.e., the reference dresser image is an image of a defective dresser), the processing device 26 determines that the dresser 22 does not have a defect when the current dresser image and the reference dresser image are dissimilar to each other. In particular, in a case where the reference dresser image is predetermined as having at least one defect, the processing device 26 determines that the dresser 22 does not have a defect when the differences determined in block 56 are above a predetermined threshold. For example, as previously discussed, in one embodiment, the processing device 26 determines differences between depth values of the current dresser image and depth values of the reference dresser images. In this embodiment, the processing device 26 determines the dresser 22 does not have defect when an average of the differences between depth values of the current dresser image and depth values of the references dresser image is greater than a predetermined threshold. As another example, as previously discussed, in one embodiment, the processing device 26 determines differences between pixel values (e.g., brightness or intensity levels of the pixels) of the current dresser image and pixel values of the reference dresser images. In this embodiment, the processing device 26 determines the dresser 22 does not have a defect when an average of the differences between pixel values of the current dresser image and pixel values of the reference dresser image is greater than a predetermined threshold.

In one embodiment, in a case where the reference dresser image is predetermined as having no defects (or an acceptable amount of defects) (i.e., the reference dresser image is an image of a non-defective dresser), the processing device 26 determines that the dresser 22 has a defect when the current dresser image and the reference dresser image are dissimilar to each other. In particular, in a case where the reference dresser image is predetermined as having no defects, the processing device 26 determines that the dresser 22 has a defect when the differences determined in block 56 are above a predetermined threshold. For example, as previously discussed, in one embodiment, the processing device 26 determines differences between depth values of the current dresser image and depth values of the reference dresser images. In this embodiment, the processing device 26 determines the dresser 22 has a defect when an average of the differences between depth values of the current dresser image and depth values of the reference dresser image is greater than a predetermined threshold. As another example, as previously discussed, in one embodiment, the processing device 26 determines differences between pixel values (e.g., brightness or intensity levels of the pixels) of the current dresser image and pixel values of the reference dresser images. In this embodiment, the processing device 26 determines the dresser 22 has a defect when an average of the differences between pixel values of the current dresser image and pixel values of the reference dresser image is greater than a predetermined threshold.

In one embodiment, in a case where the reference dresser image is predetermined as having no defects (or an acceptable amount of defects) (i.e., the reference dresser image is an image of a defective dresser), the processing device 26 determines that the dresser 22 does not have defect when the current dresser image and the reference dresser image are similar to each other. In particular, in a case where the reference dresser image is predetermined as having no defects, the processing device 26 determines that the dresser 22 does not have a defect when the differences determined in block 56 are below a predetermined threshold. For example, as previously discussed, in one embodiment, the processing device 26 determines differences between depth values of the current dresser image and depth values of the reference dresser images. In this embodiment, the processing device 26 determines the dresser 22 does not have defect when an average of the differences between depth values of the current dresser image and depth values of the reference dresser image is smaller than a predetermined threshold. As another example, as previously discussed, in one embodiment, the processing device 26 determines differences between pixel values (e.g., brightness or intensity levels of the pixels) of the current dresser image and pixel values of the reference dresser images. In this embodiment, the processing device 26 determines the dresser 22 does not have a defect when an average of the differences between pixel values of the current dresser image and pixel values of the reference dresser image is smaller than a predetermined threshold.

In one embodiment, a user inspects the dresser 22 to determine whether or not the dresser 22 has a defect. For example, in one embodiment, the user determines that the dresser 22 is defective when the user discovers one or more of trenches in the dresser 22, abnormal particles (e.g., debris) stuck or lodged into the dresser 22, fractures in the teeth of the dresser 22, and/or cracks in the dresser 22. Conversely, in one embodiment, the user determines that the dresser 22 is not defective when the user does not discover one or more of trenches in the dresser 22, abnormal particles (e.g., debris) stuck or lodged into the dresser 22, fractures in the teeth of the dresser 22, and/or cracks in the dresser 22.

In block 60, the method 42 moves to block 62 or returns to block 46 based on whether or not the processing device 26 determines that the dresser 22 has a defect in block 58.

If the processing device 26 determines that the dresser 22 does not have a defect in block 58 (i.e., the dresser 22 is non-defective), the method 42 returns to block 46. Upon returning the block 46, another current image of the dresser 22 of the CMP system 10 is generated. Namely, the processing device 26 instructs the imaging device 24 to capture and generate another current image of the abrasive surface 40 of the dresser 22. The method 42 then repeats blocks 54, 56, 58, 60, as discussed above. In one embodiment, the CMP process performed in block 44 continues to be executed while blocks 54, 56, 58, 60 are repeated.

If the processing device 26 determines that the dresser 22 has a defect in block 58 (i.e., the dresser 22 is defective), the method 42 moves to block 62. In block 62, the processing device 26 adjusts the CMP process performed in block 44.

In one embodiment, the processing device 26 adjusts the CMP process by halting the CMP process. For example, in one embodiment, the processing device 26 controls at least one of the turn table 12 to stop rotating around the axis of rotation 28, the carrier 16 to remove the workpiece 8 from physical contact with the upper surface 31 of the polishing pad 14, the carrier 16 to stop rotating around the axis of rotation 32, the dresser arm 20 to stop moving the dresser 22 across the upper surface 31 of the polishing pad 14, and the dresser arm 20 to stop rotating the dresser 22 around the axis of rotation 36.

In one embodiment, the processing device 26 adjusts the CMP process by adjusting the speed at which the CMP process of block 44 is being performed. For example, in one embodiment, the processing device 26 controls at least one of the turn table 12 to reduce the turn table's 12 rotating speed around the axis of rotation 28, the carrier 16 to reduce the carrier's 16 rotating speed around the axis of rotation 32, the dresser arm 20 to reduce the movement speed of the dresser 22 across the upper surface 31 of the polishing pad 14, and the dresser arm 20 to reduce the rotating speed of the dresser 22 around the axis of rotation 36. As another example, in one embodiment, the processing device 26 controls at least one of the turn table 12 to increase the turn table's 12 rotating speed around the axis of rotation 28, the carrier 16 to increase the carrier's 16 rotating speed around the axis of rotation 32, the dresser arm 20 to increase the movement speed of the dresser 22 across the upper surface 31 of the polishing pad 14, and the dresser arm 20 to increase the rotating speed of the dresser 22 around the axis of rotation 36. In this embodiment, subsequent to the CMP process being adjusted, the method 42 returns to block 44 to continue the CMP process.

Subsequent to determining whether or not the dresser 22 has a defect in block 58, the current dresser image is also used to improve the judgement ability of the processing device 26 and to update the dresser image database. Returning to block 58, in one embodiment, the method 42 moves to block 64.

In block 64, the processing device 26 removes, or at least reduces, noise from the current dresser image generated in block 46. Noise in the current dresser image may result in one or more of film grain in the current dresser image, inaccurate depth values in the current dresser image, and inaccurate pixel values in the current dresser image. Thus, by removing noise from the current dresser image, accuracy of depth values and pixel values may be improved, and any future determinations made based on the current dresser image (e.g., the determinations made in blocks 56 and 58) may be improved.

Noise in the current dresser image may be caused from a wide variety of sources. For example, noise in the current dresser image may be caused by electrical interference from operation of the various components of the CMP system 10 (e.g., operation of at least one of the turn table 12, the carrier 16, the slurry applicator 18, the dresser arm 20, the processing device 26, and the dresser image database 27). Noise in the current dresser image may also be caused by physical sources, such as from dust or by-products of the slurry, the workpiece, and/or the polishing pad.

Noise in the current dresser image may be reduced or removed using any type of image processing technique. For example, the processing device 26 may use image filters, averaging techniques, etc.

In one embodiment, noise from the current dresser image is removed or reduced prior to the determinations in block 56 and 58. For example, in one embodiment, processing device 26 removes or reduces noise from the current dresser image subsequent to the current image being generated in block 46 and prior to the comparison between the current dresser image and the reference dresser images in block 54. Because noise from the current dresser images is removed, the current dresser image provides an accurate representation of the dresser. As a result, the accuracy of decisions made based on the current dresser image are improved. For example, in block 56, the accuracy of the difference values between the current dresser image and the reference dresser images may be improved.

In block 66, the processing device 26 classifies the current dresser image generated in block 46. In one embodiment, the processing device 26 classifies the current dresser image generated in block 46 subsequent to the noise being removed from the current dresser image in block 64.

In one embodiment, the processing device 26 classifies the current dresser image based on the determination made in block 58. For example, in one embodiment, the processing device 26 classifies the current dresser image as having at least one defect in the event that the processing device 26 determines that the dresser 22 has a defect in block 58. Conversely, in one embodiment, the processing device 26 classifies the current dresser image as having no defects in the event that the processing device 26 determines that the dresser 22 has no defects in block 58.

In one embodiment, in a case where the processing device 26 classifies the current dresser image as having defects, the processing device 26 further classifies the current dresser image based on a type of defect. For example, in one embodiment, if the current dresser image is determined to be similar to a reference dresser image that is predetermined to have trenches (e.g., the trenches 50 as shown in FIG. 3), the processing device 26 classifies the current dresser image as having trenches. Other types of defects that may be classified include abnormal particles (e.g., debris) stuck or lodged into the dresser, fractures in the teeth of the dresser, and/or cracks in the dresser.

In block 68, the processing device 26 collects classified dresser images, including the current dresser image that was classified in block 66. In one embodiment, the classified dresser images are collected from a wide variety of sources. For example, the classified dresser images may be obtained from the CMP system 10 and a plurality of other CMP systems.

In block 70, the processing device 26 updates the judgement ability of the CMP system 10. In particular, the processing device 26 updates the judgement ability of the CMP system 10 to improve its ability to determine whether or not the dresser 22 has a defect in block 58 based on the classified dresser images that were collected in block 68. For example, in one embodiment, the processing device 26 uses various machine learning or artificial intelligence techniques on the collected classified dresser images to better utilize the differences between the current dresser image and the reference dresser images that were determined in block 56 for determining whether or not the dresser 22 has a defect in block 58.

Artificial intelligence is used herein to broadly describe any computationally intelligent systems and methods that can learn knowledge (e.g., based on training data), and use such learned knowledge to adapt their approaches for solving one or more problems, for example, by making inferences based on a received input, such as dresser images Machine learning generally refers to a sub-field or category of artificial intelligence, and is used herein to broadly describe any algorithms, mathematical models, statistical models, or the like that are implemented in one or more computer systems or circuitry, such as processing circuitry, and which build one or more models based on sample data (or training data) in order to make predictions or decisions, such as the determination of whether or not the dresser 22 has a defect in block 58 based on the classified dresser images that were collected in block 68.

In block 72, the processing device 26 updates the dresser image database 27. In one embodiment, the processing device 26 updates the dresser image database 27 by uploading the classified current dresser images that were collected in block 68, along with corresponding classification information (e.g., classifications as determined in block 66), to the dresser image database 27. As a result, the processing device 26 obtains the latest reference dresser images from the dresser image database 27 in block 52. In one embodiment, subsequent to block 72, the method 42 returns to block 44.

Although block 72 is shown subsequent to block 70, in one embodiment, block 72 is performed prior to or concurrently with block 70.

Although blocks 64, 66, 68, 70, and 72 are described above as being performed by the processing device 26, blocks 64, 66, 68, 70, and 72 may also be performed by another, separate processing device. For example, in one embodiment, the processing device 26 transmits the current dresser image to another processing device, and the other processing device subsequently performs blocks 64, 66, 68, 70, and 72.

The various described embodiments provide a CMP system and a method of using the same. The CMP system includes an imaging device, such as a laser scanner, that obtains an image of a dresser of the CMP system in real time or in-situ with a CMP process. A processing device of the CMP system compares the obtained image with one or more of reference images to determine whether or not the dresser has a defect. The processing device then adjusts the CMP process based on whether or not the dresser includes a defect. For example, in a case where the processing device determines that the dresser has a defect, the processing device may halt the CMP process. As a result, any damage to the dresser may be immediately detected, and damage, such as scratches, to a workpiece may be avoided.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

According to one embodiment disclosed herein a chemical mechanical planarization (CMP) system includes a turn table; a polishing pad on the turn table; a carrier configured to hold a wafer; a slurry applicator, which, in operation, dispenses a slurry; a dresser arm; a dresser coupled to the dresser arm, the dresser including an abrasive surface; an imaging device, which, in operation, captures an image of the abrasive surface; and a processing device, which, in operation, determines whether or not the dresser includes a defect based on the image of the abrasive surface.

According to one embodiment disclosed herein a method includes performing, by a chemical mechanical planarization (CMP) system, a CMP process; capturing, by an imaging device, an image of a dresser of the CMP system;

obtaining, by a processing device, a reference dresser image from a database; determining, by the processing device, differences between the image of the dresser and the reference dresser image; determining, by the processing device, whether or not the dresser includes a defect based on the differences between the image of the dresser and the reference dresser image; and adjusting, by the processing device, the CMP process in response to determining the dresser includes a defect.

According to one embodiment disclosed herein a method includes performing, by a chemical mechanical planarization (CMP) system, a CMP process; capturing, during the CMP process, an image of a dresser of the CMP system; obtaining a reference dresser image from a database; classifying the image of the dresser as being an image of a defective dresser or an image of a non-defective dresser based on a comparison between the image of the dresser and the reference dresser image; and storing the classified image of the dresser in the database.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical planarization (CMP) system, comprising:
    a turn table;
    a polishing pad on the turn table;
    a carrier overlying the turn table, the carrier configured to hold a wafer and move the wafer to be in contact with the polishing pad;
    a slurry applicator overlying the turn table, the slurry applicator, in operation, dispenses a slurry on to the polishing pad;
    a dresser arm configured to move to a first position and a second position;
    a dresser coupled to the dresser arm, the dresser including an abrasive surface, the abrasive surface of the dresser contacts and reconditions the polishing pad in response to the dresser arm being moved to the first position, the abrasive surface of the dresser positioned away from the polishing pad in response to the dresser arm being moved to the second position;
    an imager configured to capture a current dresser image of the abrasive surface of the dresser in response to the dresser arm being moved to the second position; and
    a processor configured to:
        instruct the dresser arm to move to the first position and the second position,
        obtain a reference dresser image,
        determine whether or not the dresser includes a defect based on differences between the current dresser image and the reference dresser image,
        classify the current dresser image with a defective classification in response to the dresser being determined to include the defect, and
        classify the current dresser image with a non-defective classification in response to the dresser being determined to not include the defect.
    the reference dresser image being a previous dresser image having the defective classification or the non-defective classification.
    in a case where the reference dresser image has the defective classification, the defective classification indicates a defect type included in the reference dresser image.

2. The system of claim 1 wherein the dresser is a diamond disk.

3. The system of claim 1 wherein the processor is configured to adjust a CMP process in response to the dresser being determined to include the defect.

4. The system of claim 1 wherein the processor is configured to halt a CMP process in response to determining the dresser includes the defect.

5. The system of claim 1, further comprising:
    a database, a plurality of reference dresser images being stored in the database, the plurality of reference dresser images including images of dressers having the defective classification or the non-defective classification, the reference dresser image being selected from the plurality of reference dresser images.

6. The system of claim 5 wherein the processor is configured to:
    update the database with the classified current dresser image.

7. The system of claim 1 wherein the dresser overlies the polishing pad in the first position, and overlies the imager in the second position.

8. A method, comprising:
    performing, by a chemical mechanical planarization (CMP) system, a CMP process, the CMP system including a polishing pad, a dresser arm, and a dresser coupled to the dresser arm, the CMP process including planarizing an object with the polishing pad;
    contacting and reconditioning the polishing pad with the dresser by moving the dresser arm to a first position;
    positioning the dresser away from the polishing pad by moving the dresser arm to a second position;
    capturing, by an imager, a current dresser image of the dresser in response to the dresser arm moving to the second position;
    obtaining, by a processor, a reference dresser image from a database;
    determining, by the processor, differences between the current dresser image and the reference dresser image;
    determining, by the processor, whether or not the dresser includes a defect based on the differences between the current dresser image and the reference dresser image; and
    adjusting, by the processor, the CMP process in response to determining the dresser includes the defect;
    classifying the current dresser image with a defective classification in response to determining the dresser includes the defect; and
    classifying the current dresser image with a non-defective classification in response to determining the dresser does not include the defect,
    the reference dresser image being a previous dresser image having the defective classification or the non-defective classification.

in a case where the reference dresser image has the defective classification, the defective classification indicates a defect type included in the reference dresser image.

9. The method of claim 8 wherein adjusting the CMP process includes halting the CMP process.

10. The method of claim 8 wherein the current dresser image is captured during the CMP process.

11. The method of claim 8, further comprising:
removing noise from the current dresser image.

12. The method of claim 8, further comprising:
collecting classified images of dressers from a plurality of different sources; and
storing the collected classified images in the database.

13. A method, comprising:
performing, by a chemical mechanical planarization (CMP) system, a CMP process, the CMP system including a polishing pad, a dresser arm, and a dresser coupled to the dresser arm, the CMP process including planarizing an object with the polishing pad;
reconditioning the polishing pad by moving the dresser arm to a first position in which the dresser is in contact with the polishing pad;
positioning the dresser away from the polishing pad by moving the dresser arm to a second position;
capturing, during the CMP process and with the dresser arm in the second position, an-a current dresser image of the dresser of the CMP system;
obtaining a reference dresser image from a database;
determining whether or not the dresser includes a defect based a comparison between the current dresser image and the reference dresser image;
classifying the current dresser image with a defective classification in response to determining the dresser includes the defect, the defective classification indicating an image of a defective dresser;
classifying the current dresser image with a non-defective classification in response to determining the dresser does not include the defect, the non-defective classification indicating an image of a non-defective dresser; and
storing the classified current dresser image in the database,
the reference dresser image being a previous dresser image having the defective classification or the non-defective classification.
in a case where the reference dresser image has the defective classification, the defective classification indicates a defect type included in the reference dresser image.

14. The method of claim 13, further comprising:
adjusting the CMP process in response to determining the dresser includes the defect.

15. The method of claim 14 wherein adjusting the CMP process includes halting the CMP process.

16. The method of claim 13, further comprising:
collecting a plurality of classified images of dressers; and
storing the collected classified images in the database.

* * * * *